US012671415B2

(12) United States Patent     (10) Patent No.:   US 12,671,415 B2

Yu et al.                    (45) Date of Patent:     Jun. 30, 2026

(54) GATE DRIVER CIRCUIT AND OPERATING METHOD THEREOF

(71) Applicant: Hon Hai Precision Industry Co., Ltd., New Taipei City (TW)

(72) Inventors: Wei-Cheng Yu, New Taipei City (TW); Chang-Ching Tu, New Taipei City (TW); Tian-Li Wu, New Taipei City (TW); Yu-Sheng Hsiao, New Taipei City (TW); Yi-Kai Hsiao, New Taipei City (TW); Chia-Lung Hung, New Taipei City (TW); Hao-Chung Kuo, New Taipei City (TW)

(73) Assignee: Hon Hai Precision Industry Co., Ltd., New Taipei City (TW)

( * ) Notice: Subject to any disclaimer, the term of this patent is extended or adjusted under 35 U.S.C. 154(b) by 14 days.

(21) Appl. No.: 18/919,410

(22) Filed: Oct. 17, 2024

(65) Prior Publication Data

US 2025/0350281 A1     Nov. 13, 2025

Related U.S. Application Data

(60) Provisional application No. 63/643,933, filed on May 8, 2024.

(51) Int. Cl.
H03K 17/687       (2006.01)

(52) U.S. Cl.
CPC ................................. H03K 17/6871 (2013.01)

(58) Field of Classification Search
CPC ............ H03K 5/01; H03K 5/04; H03K 5/125; H03K 5/1252; H03K 17/04; H03K 17/041;

(Continued)

(56) References Cited

U.S. PATENT DOCUMENTS

| 9,595,954 | B2 | 3/2017 | Sicard | |
| 2009/0033405 | A1* | 2/2009 | Yanagishima | .......... H02M 1/08 |
| | | | | 327/427 |

(Continued)

FOREIGN PATENT DOCUMENTS

| EP | 3474449 | 11/2020 |
| TW | 202029628 | 8/2020 |

OTHER PUBLICATIONS

"Search Report of Europe Counterpart Application", issued on Jul. 17, 2025, p. 1-p. 15.

(Continued)

*Primary Examiner* — Long Nguyen

(74) *Attorney, Agent, or Firm* — JCIPRNET

(57) ABSTRACT

A gate driver circuit and an operating method thereof are provided. The gate driver circuit includes a charge sharing circuit including a first resistor, a second resistor, a first capacitor, a second capacitor, a first switching transistor, and a second switching transistor. A first terminal of the first resistor is coupled to a first working voltage. A first terminal of the first capacitor is coupled to a second terminal of the first resistor, and a second terminal is coupled to a second working voltage. A first terminal of the first switching transistor is coupled to the second terminal of the first resistor and the first terminal of the first capacitor, and a second terminal is coupled to a circuit node. A first terminal of the second switching transistor is coupled to the circuit node.

14 Claims, 7 Drawing Sheets

(58) Field of Classification Search

CPC ............. H03K 17/04106; H03K 17/08; H03K 17/081; H03K 17/08104; H03K 17/16; H03K 17/161; H03K 17/162; H03K 17/163; H03K 17/164; H03K 17/51; H03K 17/56; H03K 17/687; H03K 17/6871; H03K 17/6872; H03K 17/6874; H03K 19/0008; H03K 19/0013; H03K 19/003; H03K 19/00315; H03K 19/00346; H03K 19/00361; H03K 19/01; H03K 19/017; H03K 19/01707; H03K 19/01721

See application file for complete search history.

(56) References Cited

U.S. PATENT DOCUMENTS

| | | | |
|---|---|---|---|
| 2011/0273206 A1 | 11/2011 | Lee | |
| 2013/0194006 A1* | 8/2013 | Yamamoto | H03K 5/1515 327/296 |
| 2019/0238129 A1 | 8/2019 | Fukushima et al. | |
| 2019/0341916 A1 | 11/2019 | Bolzenius et al. | |

OTHER PUBLICATIONS

"Partial Search Report of Europe Counterpart Application", issued on Apr. 29, 2025, p. 1-p. 15.

"Office Action of Taiwan Counterpart Application", issued on Apr. 24, 2025, p. 1-p. 3.

\* cited by examiner

GATE DRIVER CIRCUIT AND OPERATING METHOD THEREOF

CROSS-REFERENCE TO RELATED APPLICATION

This application claims the priority benefit of U.S. Provisional Application No. 63/643,933, filed on May 8, 2024. The entirety of the above-mentioned patent application is hereby incorporated by reference herein and made a part of this specification.

BACKGROUND

Technical Field

The disclosure relates to a driver circuit, and in particular to a gate driver circuit and an operating method thereof.

Description of Related Art

Currently, the N-type metal-oxide-semiconductor field-effect transistor (MOSFET) made of silicon carbide (SiC) is widely applied to various power electronic apparatuses, such as a power conversion system of an electric vehicle, due to the characteristics of high breakdown electric field and good thermal conductivity of the SiC MOSFET. However, under a fast switching operation of a traditional gate driver for driving a transistor, the transistor is prone to voltage/current overshoot and high energy loss, so the traditional gate driver has issues such as low reliability and the transistor being prone to degradation.

SUMMARY

The disclosure provides a gate driver circuit and an operating method thereof, which can implement effective gate driving function.

A gate driver circuit of the disclosure includes a charge sharing circuit. The charge sharing circuit includes a first resistor, a second resistor, a first capacitor, a second capacitor, a first switching transistor, and a second switching transistor. A first terminal of the first resistor is coupled to a first working voltage. A first terminal of the first capacitor is coupled to a second terminal of the first resistor. A second terminal of the first capacitor is coupled to a second working voltage. A first terminal of the first switching transistor is coupled to the second terminal of the first resistor and the first terminal of the first capacitor. A control terminal of the first switching transistor receives a first switching signal. A second terminal of the first switching transistor is coupled to a circuit node. A first terminal of the second switching transistor is coupled to the circuit node. A control terminal of the second switching transistor receives a second switching signal. A first terminal of the second capacitor is coupled to a second terminal of the second switching transistor and a first terminal of the second resistor. A second terminal of the second capacitor is coupled to the second working voltage. The first terminal of the second resistor is coupled to the second terminal of the second switching transistor. A second terminal of the second resistor is coupled to the second working voltage.

An operating method of the disclosure is adapted to a gate driver. The gate driver includes a charge sharing circuit. The charge sharing circuit includes a first resistor, a second resistor, a first capacitor, a second capacitor, a first switching transistor, and a second switching transistor. The first resistor is coupled to the first capacitor and the first switching transistor. The second resistor is coupled to the second capacitor and the second switching transistor. The first switching transistor and the second switching transistor are also coupled to a circuit node. The operating method includes receiving a first switching signal through a control terminal of the first switching transistor; and receiving a second switching signal through a control terminal of the second switching transistor. A conduction period of the first switching transistor and a conduction period of the second switching transistor are non-overlapping and have a time interval.

Based on the above, the gate driver circuit and the operating method thereof of the disclosure can quickly adjust the gate-source voltage (Vgs) of the power transistor to be driven through the charging/discharging operation of the first capacitor and the second capacitor, and can slow down the switching speed through the first resistor and the second resistor to effectively suppress the overshoot of the transistor and effectively improve the reliability of the transistor.

In order for the features and advantages of the disclosure to be more comprehensible, the following specific embodiments are described in detail in conjunction with the drawings.

DESCRIPTION OF THE EMBODIMENTS

Figure 1:
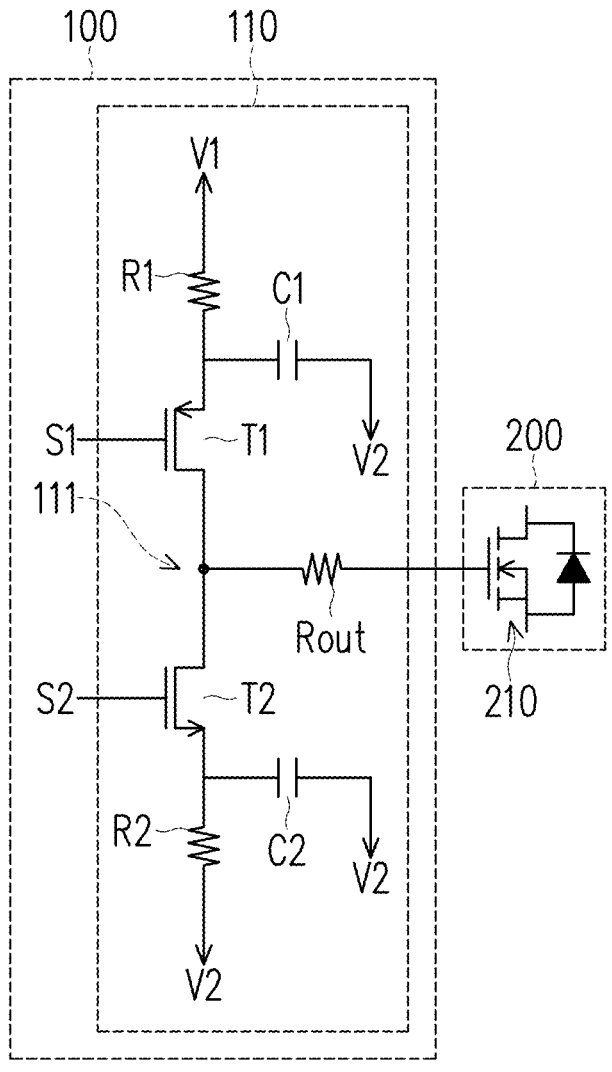
FIG. 1 is a schematic circuit diagram of a gate driver circuit according to an embodiment of the disclosure.

Reference will now be made in detail to the exemplary embodiments of the disclosure, and examples of the exemplary embodiments are illustrated in the drawings. Wherever possible, the same reference numerals are used in the drawings and the description to refer to the same or similar parts.

FIG. 1 is a schematic circuit diagram of a gate driver circuit according to an embodiment of the disclosure. Referring to FIG. 1, a gate driver circuit 100 includes a charge sharing circuit 110. The charge sharing circuit 110 may be coupled to a power transistor 210 in a load circuit 200. In the embodiment, the load circuit 200 may be, for example, a half-bridge circuit, a full-bridge circuit, or a related power circuit and has at least one power transistor. Each power transistor of the load circuit 200 may be individually coupled to the corresponding charge sharing circuit 110, but the disclosure is not limited thereto. In the embodiment, the power transistor 210 may be, for example, an N-type metaloxide-semiconductor field-effect transistor (MOSFET) made of silicon carbide (SiC), but the disclosure is not limited thereto.

In the embodiment, the charge sharing circuit 110 includes a first resistor R1, a second resistor R2, a first capacitor C1, a second capacitor C2, a first switching transistor T1, and a second switching transistor T2. In the embodiment, a first terminal of the first resistor R1 is coupled to a first working voltage V1. A first terminal of the first capacitor C1 is coupled to a second terminal of the first resistor R1. A second terminal of the first capacitor C1 is coupled to a second working voltage V2. A first terminal of the first switching transistor T1 is coupled to the second terminal of the first resistor R1 and the first terminal of the first capacitor C1. A control terminal of the first switching transistor T1 receives a first switching signal S1. A second terminal of the first switching transistor T1 is coupled to a circuit node 111. A first terminal of the second switching transistor T2 is coupled to the circuit node 111. A control terminal of the second switching transistor T2 receives a second switching signal S2. A first terminal of the second capacitor C2 is coupled to a second terminal of the second switching transistor T2 and a first terminal of the second resistor R2. A second terminal of the second capacitor C2 is coupled to the second working voltage V2. The first terminal of the second resistor R2 is coupled to the second terminal of the second switching transistor T2. A second terminal of the second resistor R2 is coupled to the second working voltage V2.

In the embodiment, the first switching transistor T1 may be a P-type MOS transistor, and the second switching transistor T2 may be an N-type MOS transistor. In the embodiment, the charge sharing circuit 110 also includes an output resistor Rout. A first terminal of the output resistor Rout is coupled to a circuit node 101. A second terminal of the output resistor Rout is coupled to a gate of the power transistor 210. In the embodiment, the first switching transistor T1 and the second switching transistor T2 are alternately turned on according to the first switching signal S1 and the second switching signal S2 respectively to form cyclically switched driving signals to the power transistor 210 and alternately drive the power transistor 210. In addition, in an embodiment, the first working voltage V1 may be, for example, 15 volts, and the second working voltage V2 may be, for example, −5 volts, but the disclosure is not limited thereto.

Figure 2:
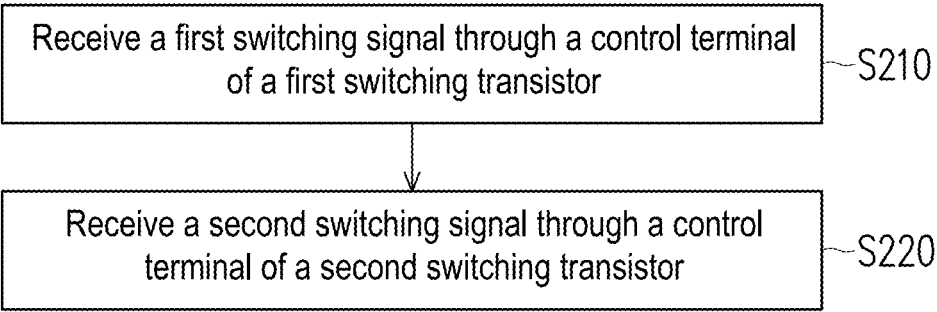
FIG. 2 is an operation flowchart of a gate driver circuit according to an embodiment of the disclosure.

FIG. 2 is an operation flowchart of a gate driver circuit according to an embodiment of the disclosure. Referring to FIG. 1 and FIG. 2, the gate driver circuit 100 may execute steps S210 and S220 below. In step S210, the charge sharing circuit 110 may receive the first switching signal S1 through the control terminal of the first switching transistor T1. In step S220, the charge sharing circuit 110 may receive the second switching signal S2 through the control terminal of the second switching transistor T2. In the embodiment, a conduction period of the first switching transistor T1 and a conduction period of the second switching transistor T2 are non-overlapping and have a time interval.

Specifically, when the first switching transistor T1 and the second switching transistor T2 both operate in a non-conducting state, the first working voltage V1 may charge the first capacitor C1 via the first resistor R1, and the second capacitor C2 may discharge from the second working voltage V2 via the second resistor R2. It should be noted that the "discharge" performed by the capacitor of the disclosure may refer to clearing the charge accumulated by the capacitor during the previous operating cycle. When the first switching transistor T1 operates in the non-conducting state and the second switching transistor T2 operates in a conducting state, the discharged second capacitor C2 may quickly pull down the gate-source voltage of the power transistor 210. In this regard, the charge of the gate of the power transistor 210 may be discharged via the second resistor R2 and the second capacitor C2, and the second resistor R2 may effectively slow down the discharging speed of the control terminal of the power transistor 210 from the output resistor Rout to the second working voltage V2 to effectively suppress the current/voltage overshoot of the gate of the power transistor 210.

When the first switching transistor T1 and the second switching transistor T2 both operate in the non-conducting state again, the first working voltage V1 may charge the first capacitor C1 via the first resistor R1, and the second capacitor C2 may be discharged from the second working voltage V2 via the second resistor R2. When the first switching transistor T1 operates in the conducting state and the second switching transistor T2 operates in the non-conducting state, the charged first capacitor C1 may quickly increase the gate-source voltage of the power transistor 210. In this regard, the first resistor R1 and the first capacitor C1 may charge the charge of the gate of the power transistor 210, and the first resistor R1 may effectively slow down the charging speed of the first working voltage V1 from the output resistor Rout to the control terminal of the power transistor 210 to effectively suppress the current/voltage overshoot of the gate of the power transistor 210.

In the embodiment, a charging path and a discharging path of the charge sharing circuit 110 do not interfere with each other, and the current/voltage overshoot of the power transistor 210 during the processes of conduction and disconnection may be effectively suppressed, and switching loss may be effectively reduced to improve the reliability of the power transistor 210.

In an embodiment, the first resistor R1 and the second resistor R2 may have the same resistance value, and the first capacitor C1 and the second capacitor C2 may have the same capacitance value, but the disclosure is not limited thereto. In another embodiment, the first resistor R1 and the second resistor R2 may respectively be 470 ohms, and the first capacitor C1 and the second capacitor C2 may respectively be 3.3 nf.

Figure 3:
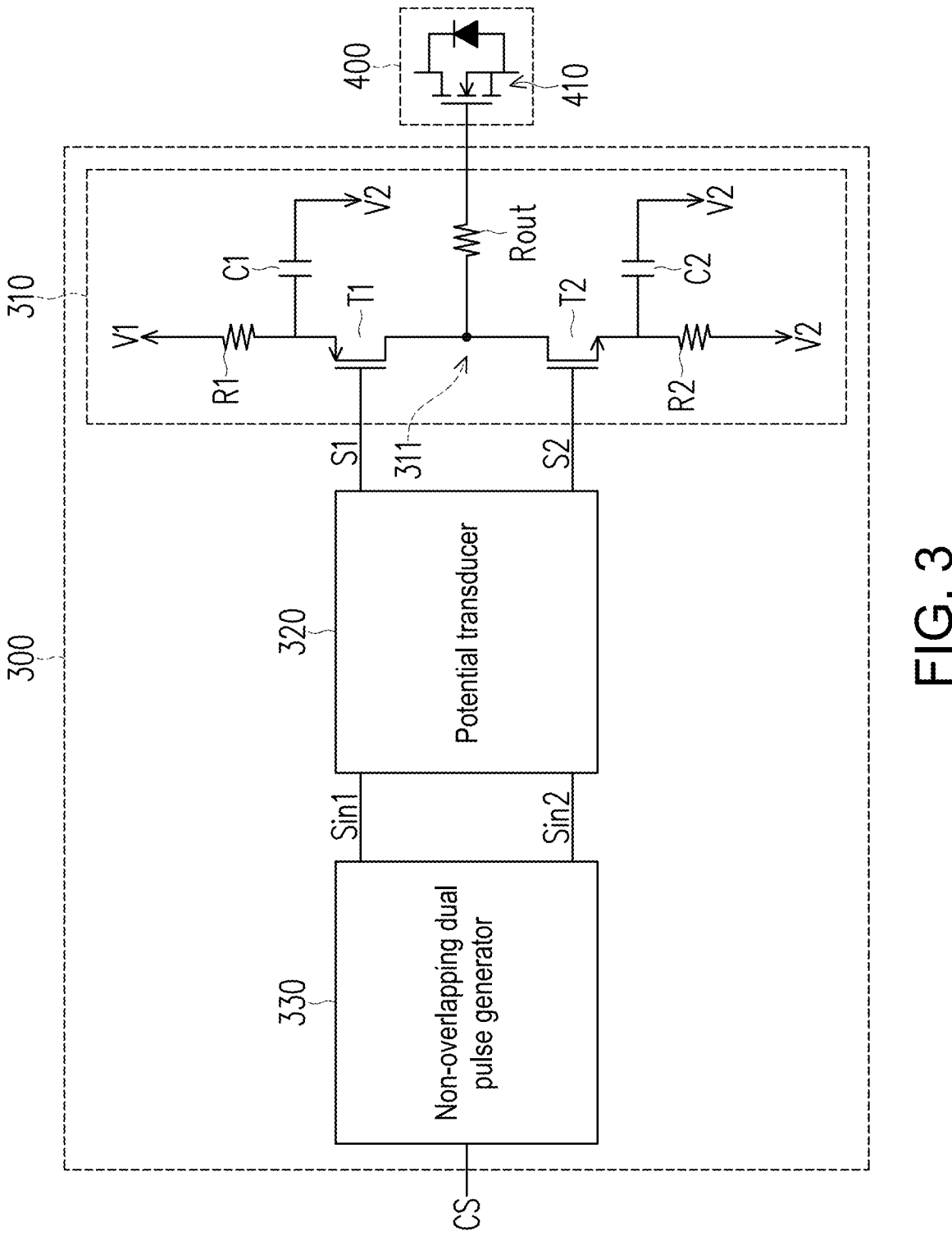
FIG. 3 is a schematic circuit diagram of a gate driver circuit according to an embodiment of the disclosure.
Figure 4:
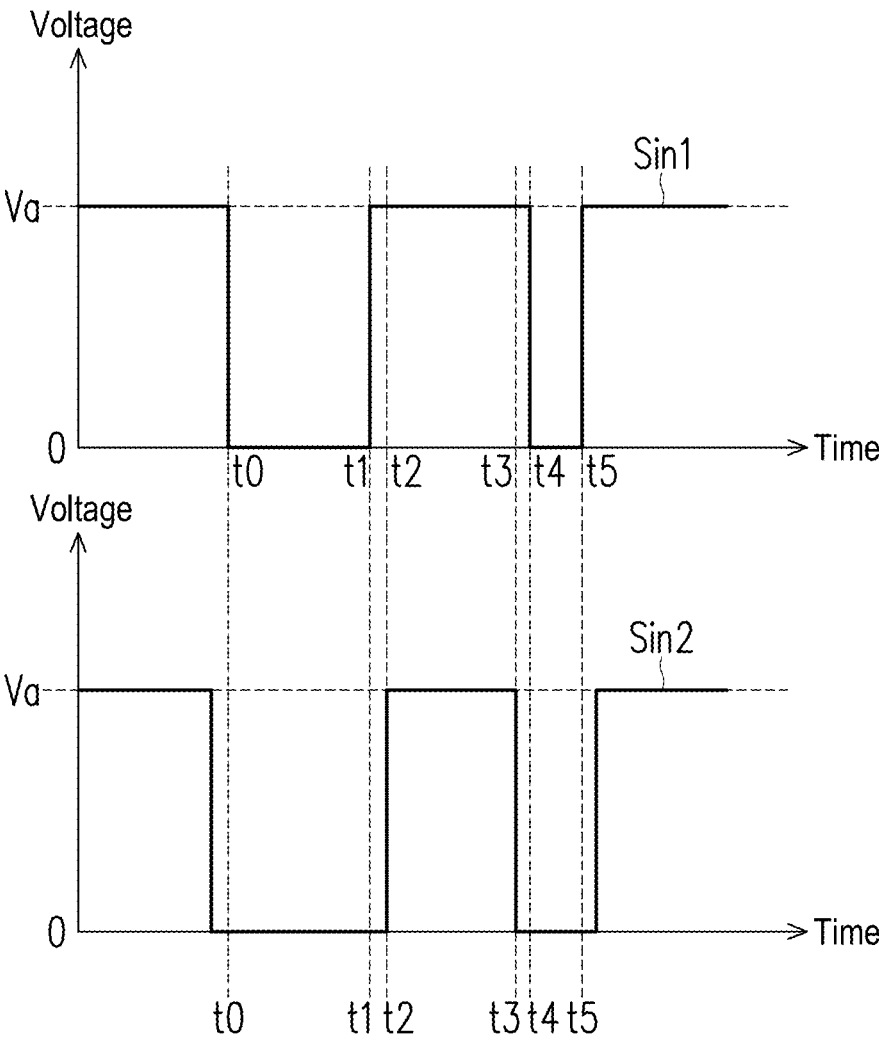
FIG. 4 is a signal waveform diagram of a first input signal and a second input signal according to an embodiment of the disclosure.
Figure 5:
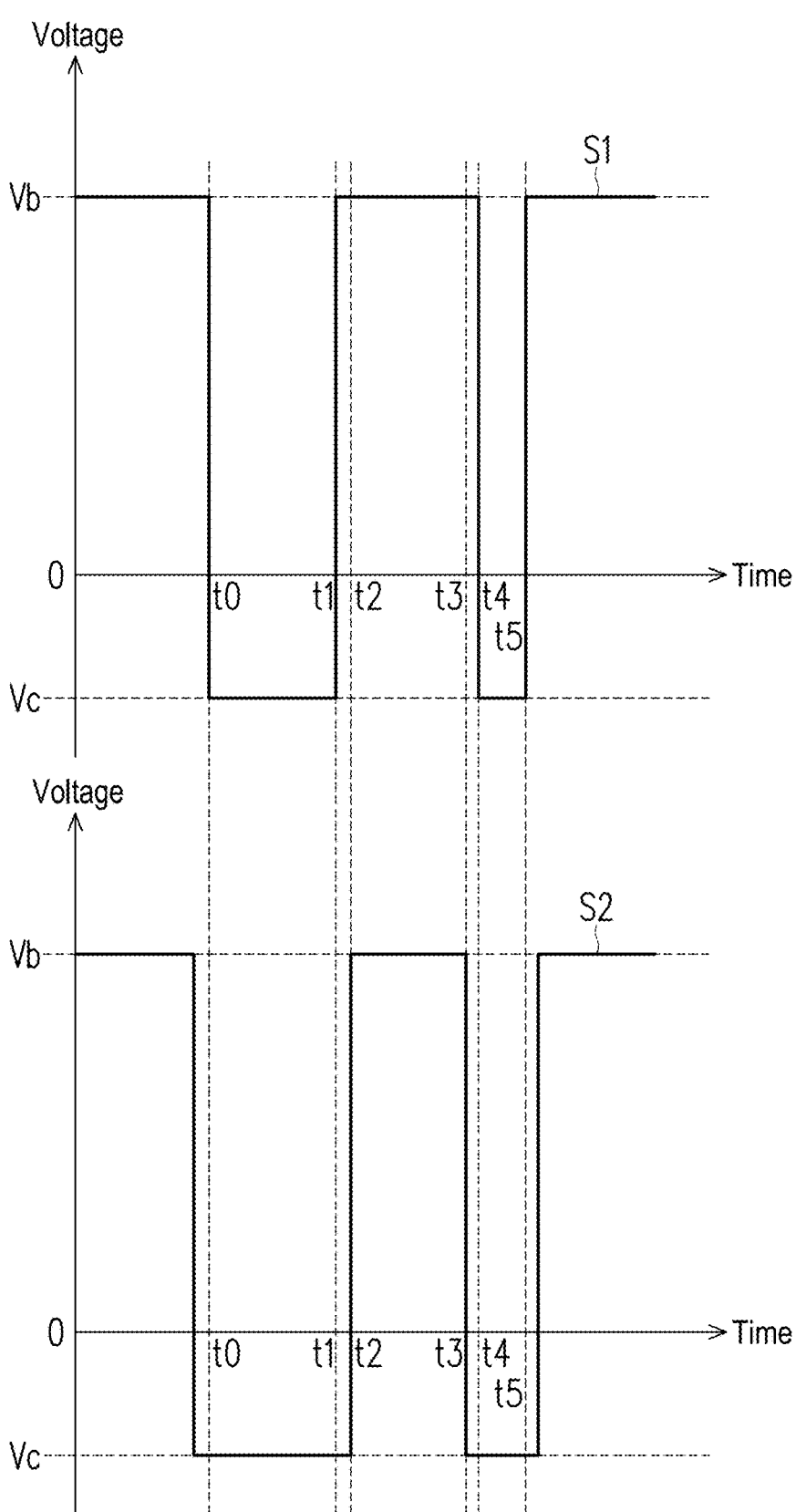
FIG. 5 is a signal waveform diagram of a first switching signal and a second switching signal according to an embodiment of the disclosure.

FIG. 3 is a schematic circuit diagram of a gate driver circuit according to an embodiment of the disclosure. FIG. 4 is a signal waveform diagram of a first input signal and a second input signal according to an embodiment of the disclosure. FIG. 5 is a signal waveform diagram of a first switching signal and a second switching signal according to an embodiment of the disclosure. Referring to FIG. 3 first, a gate driver circuit 300 includes a charge sharing circuit 310, a potential transducer 320, and a non-overlapping double pulse generator 330. The charge sharing circuit 310 may be coupled to a power transistor 410 in a load circuit 400 and is also coupled to the potential transducer 320. The potential transducer 320 is also coupled to the non-overlapping double pulse generator 330. In the embodiment, the charge sharing circuit 310 includes a circuit node 311, a first resistor R1, a second resistor R2, a first capacitor C1, a second capacitor C2, a first switching transistor T1, and a second switching transistor T2. For the circuit structure of the charge sharing circuit 310, reference may be made to the description of the charge sharing circuit 110 of the embodiment of FIG. 1, so no further description will be given.

In the embodiment, the non-overlapping double pulse generator 330 may receive a control signal CS. The non-overlapping double pulse generator 330 may generate a first input signal Sin1 and a second input signal Sin2 according to the control signal CS. In the embodiment, the control signal CS may be a pulse width modulation (PWM) signal.

Specifically, referring to FIG. 4, the non-overlapping double pulse generator 330 may generate, for example, the first input signal Sin1 and the second input signal Sin2 shown in FIG. 4 according to the control signal CS. At time t0, the first input signal Sin1 may be switched from a high voltage level (for example, a voltage Va) to 0 voltage level, and the second input signal Sin2 may have 0 voltage level. At time t1, the first input signal Sin1 may be switched from 0 voltage level to a high voltage level, and the second input signal Sin2 may be maintained at a low voltage level. At time t2, the first input signal Sin1 may be maintained at the high voltage level, and the second input signal Sin2 may be switched from 0 voltage level to a high voltage level. At time t3, the first input signal Sin1 may be maintained at the high voltage level, and the second input signal Sin2 may be switched from the high voltage level to 0 voltage level. At time t4, the first input signal Sin1 may be switched from the high voltage level to 0 voltage level, and the second input signal Sin2 may be maintained at 0 voltage level. By analogy, a rising edge and a falling edge of each pulse wave of the first input signal Sin1 and a rising edge and a falling edge of each pulse wave of the second input signal Sin2 are non-overlapping. In addition, in an embodiment, the voltage Va with the high voltage level may be, for example, 5 volts, but the disclosure is not limited thereto.

In the embodiment, the potential transducer 320 may receive the first input signal Sin1 and the second input signal Sin2, and convert the potentials of the first input signal Sin1 and the second input signal Sin2 to generate the first switching signal S1 and the second switching signal S2. The potential transducer 320 may receive the first input signal Sin1 and the second input signal Sin2, and convert the first input signal Sin1 and the second input signal Sin2 into the first switching signal S1 and the second switching signal S2 having voltage amplitudes of a voltage Vb to a voltage Vc to implement low conduction resistance, wherein the voltage Vb (a high voltage level) may be greater than the voltage Vc (a low voltage level). In an embodiment, the voltage Vb may be, for example, 15 volts, and the voltage Vc may be, for example, −5 volts, but the disclosure is not limited thereto. In addition, a timing relationship between rising edges and falling edges of the first switching signal S1 and the second switching signal S2 is the same as a timing relationship between the rising edges and the falling edges of the first input signal Sin1 and the second input signal Sin2.

In addition, it should be explained first that if the voltage Vb is applied to a gate of the first switching transistor T1, the first switching transistor T1 switch may be switched to a disconnected state. If the voltage Vb is applied to a gate of the second switching transistor T2, the second switching transistor T2 may be switched to the conducting state. If the voltage Vc is applied to the gate of the first switching transistor T1, the first switching transistor T1 may be switched to the conducting state. If the voltage Vc is applied to the gate of the second switching transistor T2, the second switching transistor T2 may be switched to the disconnected state.

Specifically, referring to FIG. 3 and FIG. 5 at the same time, at time t0, the first switching signal S1 may have the voltage Vc, and the second switching signal S2 may switch from the voltage Vb to the voltage Vc. Therefore, during the period from time t0 to time t1, the first switching transistor T1 may operate in the conducting state, and the second switching transistor T2 may operate in the non-conducting state. In this regard, the previously charged first capacitor C1 may quickly increase the gate-source voltage of the power transistor 410. The first resistor R1 and the first capacitor C1 may charge the charge of the gate of the power transistor 410, and the first resistor R1 may effectively slow down the charging speed of the first working voltage V1 from the output resistor Rout to the control terminal of the power transistor 410 to effectively suppress the current/voltage overshoot of the gate of the power transistor 410.

At time t1, the first switching signal S1 may be switched from the voltage Vc to the voltage Vb, and the second input signal Sin2 may be maintained at the voltage Vc. Therefore, during the period from time t1 to time t2, the first switching transistor T1 and the second switching transistor T2 may both operate in the non-conducting state. The first capacitor C1 may be charged, and the second capacitor C2 may be discharged.

At time t2, the first switching signal S1 may be maintained at the voltage Vb, and the second input signal Sin2 may be switched from the voltage Vc to the voltage Vb. Therefore, during the period from time t2 to time t3, the first switching transistor T1 may operate in the non-conducting state, and the second switching transistor T2 may operate in the conducting state. In this regard, the previously discharged second capacitor C2 may quickly pull down the gate-source voltage of the power transistor 410. The charge of the gate of the power transistor 410 may be discharged via the second resistor R2 and the second capacitor C2, and the second resistor R2 may effectively slow down the discharging speed of the control terminal of the power transistor 410 from the output resistor Rout to the second working voltage V2 to effectively suppress the current/voltage overshoot of the gate of the power transistor 410.

At time t3, the first switching signal S1 may be maintained at the voltage Vb, and the second switching signal S2 may be switched from the voltage Vb to the voltage Vc. Therefore, during the period from time t3 to time t4, the first switching transistor T1 and the second switching transistor T2 may both operate in the non-conducting state. The first capacitor C1 may be charged, and the second capacitor C2 may be discharged.

At time t4, the first switching signal S1 may be switched from the voltage Vb to the voltage Vc, and the second switching signal S2 may be maintained at the voltage Vc. Therefore, during the period from time t4 to time t5, the first switching transistor T1 may operate in the conducting state, and the second switching transistor T2 may operate in the non-conducting state. In this regard, the previously charged first capacitor C1 may quickly increase the gate-source voltage of the power transistor 410. The first resistor R1 and the first capacitor C1 may charge the charge of the gate of the power transistor 410, and the first resistor R1 may effectively slow down the charging speed of the first working voltage V1 from the output resistor Rout to the control terminal of the power transistor 410 to effectively suppress the current/voltage overshoot of the gate of the power transistor 410.

By analogy, during the process of the gate driver circuit 300 driving the power transistor 410, the conduction period of the first switching transistor T1 and the conduction period of the second switching transistor T2 are non-overlapping and have a time interval. Therefore, the power transistor 410 may be effectively prevented from being accidentally turned on.

Figure 6:
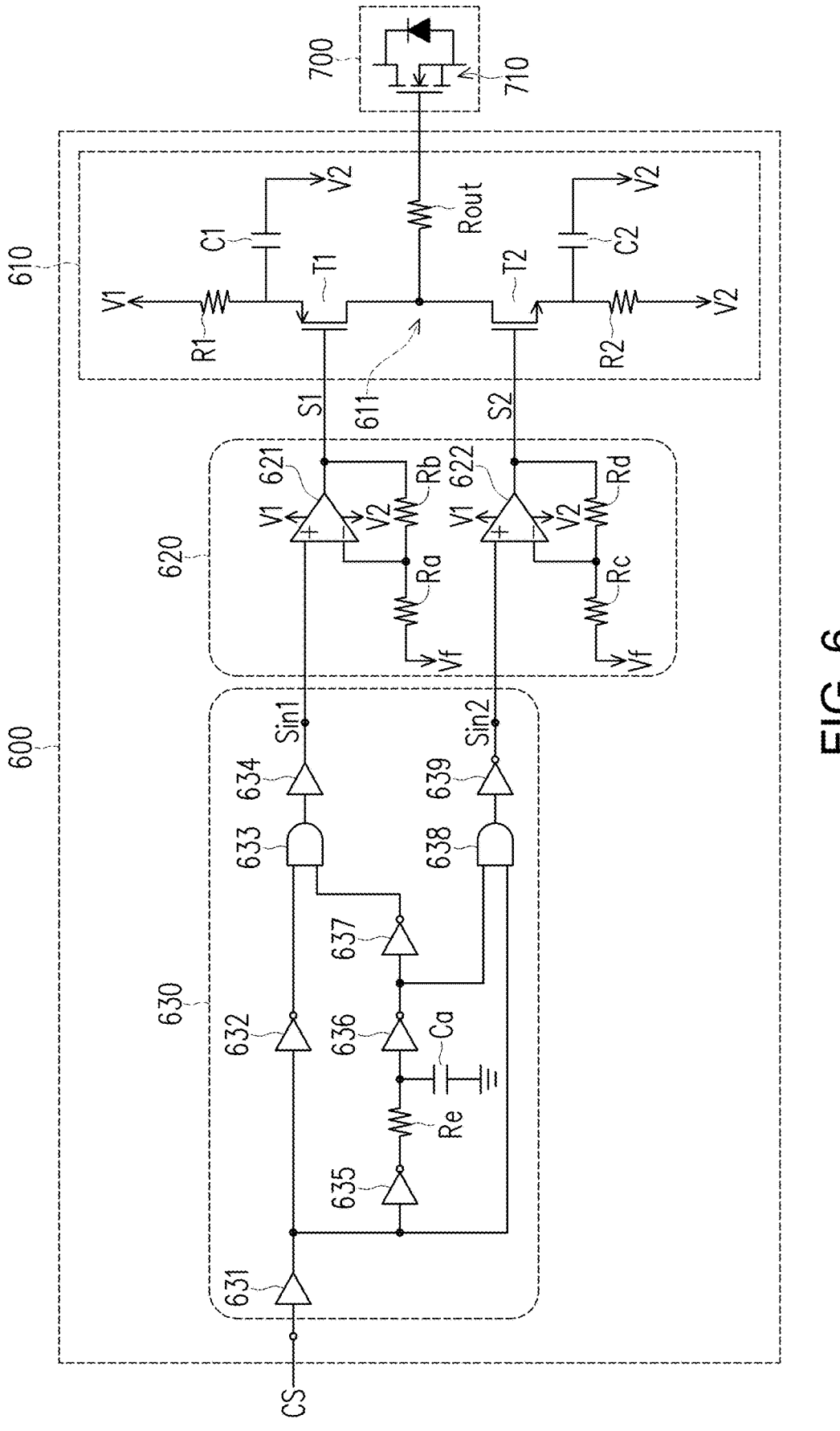
FIG. 6 is a schematic circuit diagram of a gate driver circuit according to an embodiment of the disclosure.

FIG. 6 is a schematic circuit diagram of a gate driver circuit according to an embodiment of the disclosure. Referring to FIG. 6, a gate driver circuit 600 includes a charge sharing circuit 610, a potential transducer 620, and a non-overlapping double pulse generator 630. The charge sharing circuit 610 may be coupled to a power transistor 710 in a load circuit 700 and is also coupled to the potential transducer 620. The potential transducer 620 is also coupled to the non-overlapping double pulse generator 630. In the embodiment, the charge sharing circuit 610 includes a circuit node 611, a first resistor R1, a second resistor R2, a first capacitor C1, a second capacitor C2, a first switching transistor T1, and a second switching transistor T2. For the circuit structure of the charge sharing circuit 610, reference may be made to the charge sharing circuit 110 of the embodiment of FIG. 1 and the charge sharing circuit 310 of the embodiment of FIG. 3, so no further description will be given.

In the embodiment, the potential transducer 620 may include a first operational amplifier 621, a second operational amplifier 622, a first voltage dividing resistor Ra, a second voltage dividing resistor Rb, a third voltage dividing resistor Rc, and a fourth voltage dividing resistor Rd. In the embodiment, a first input terminal of the first operational amplifier 621 receives the first input signal Sin1. An output terminal of the first operational amplifier 621 is coupled to the control terminal of the first switching transistor T1 to output the first switching signal S1 to the control terminal of the first switching transistor T1. A first input terminal of the second operational amplifier 622 receives the second input signal Sin2. An output terminal of the second operational amplifier 622 is coupled to the control terminal of the second switching transistor T2 to output the second switching signal S2 to the control terminal of the second switching transistor T2. In the embodiment, the first voltage dividing resistor Ra is coupled between a second input terminal of the first operational amplifier 621 and a reference voltage Vf. The second voltage dividing resistor Rb is coupled between the output terminal and the second input terminal of the first operational amplifier 621. The third voltage dividing resistor Rc is coupled between a second input terminal of the second operational amplifier 622 and the reference voltage Vf. The fourth voltage dividing resistor Rd is coupled between the output terminal and the second input terminal of the second operational amplifier 622.

In the embodiment, the non-overlapping double pulse generator 630 may include a first buffer 631, a first inverter 632, a first AND gate 633, a second buffer 634, a second inverter 635, a resistor Re, a capacitor Ca, a third inverter 636, a fourth inverter 637, a second AND gate 638, and a fifth inverter 639.

In the embodiment, an input terminal of the first buffer 631 receives the control signal CS. An input terminal of the first inverter 632 is coupled to an output terminal of the first buffer 631. A first input terminal of the first AND gate 633 is coupled to an output terminal of the first inverter 632. An input terminal of the second buffer 634 is coupled to an output terminal of the first AND gate 633, and an output terminal of the second buffer 634 is coupled to the non-overlapping double pulse generator 632 to output the first input signal Sin1 to the potential transducer 620.

In the embodiment, an input terminal of the second inverter 635 is coupled to the output terminal of the first buffer 631. A first terminal of the resistor Re is coupled to an output terminal of the second inverter 636. A first terminal of the capacitor Ca is coupled to a second terminal of the resistor Re. A second terminal of the capacitor Ca is coupled to a ground voltage. An input terminal of the third inverter 636 is coupled to the second terminal of the resistor Re. An input terminal of the fourth inverter 637 is coupled to an output terminal of the third inverter 636. An output terminal of the fourth inverter 637 is coupled to a second input terminal of the first inverter 634. A first input terminal of the second AND gate 638 is coupled to the output terminal of the third inverter 636, and a second input terminal of the second AND gate 638 is coupled to the output terminal of the first buffer 631. An input terminal of the fifth inverter 639 is coupled to an output terminal of the second AND gate 638, and an output terminal of the fifth inverter 639 is coupled to the non-overlapping double pulse generator 620 to output the second input signal S2.

Figure 7A:
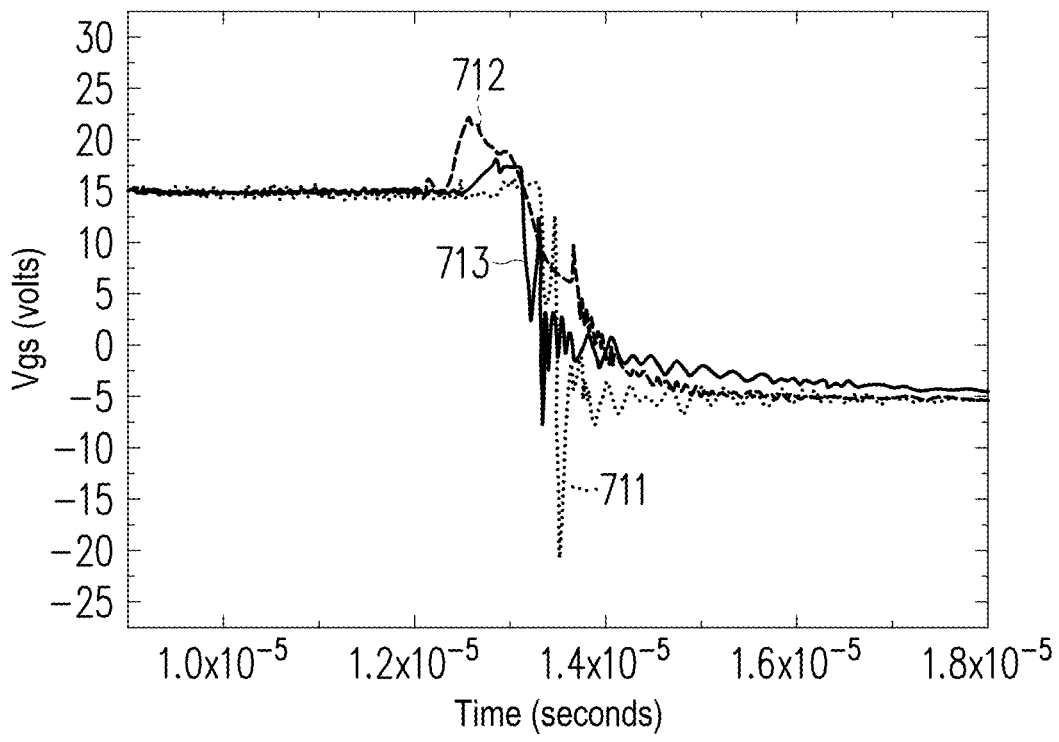
FIG. 7A and FIG. 7B are schematic diagrams of changes in gate-source voltage (Vgs) of a power transistor according to an embodiment of the disclosure.
Figure 7B:
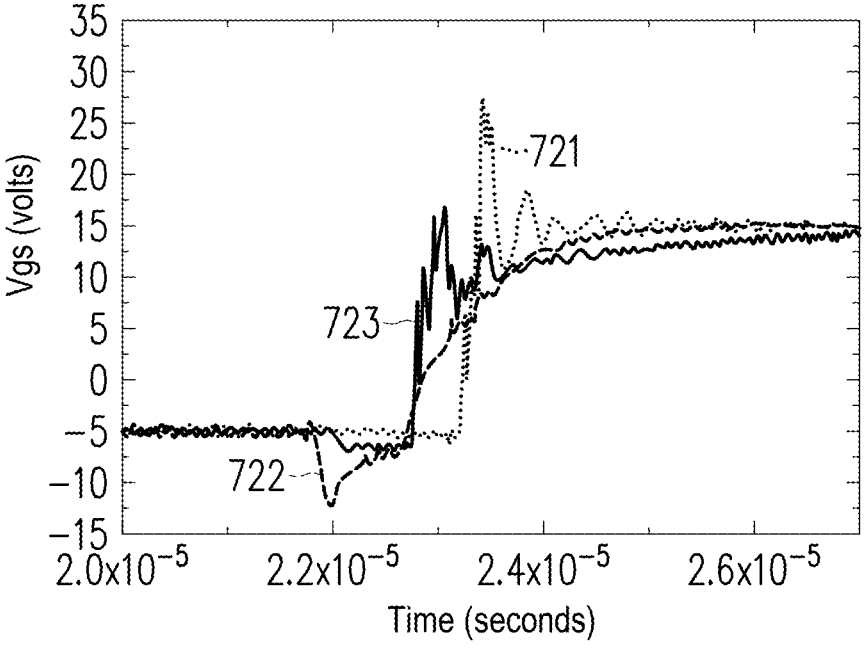

FIG. 7A and FIG. 7B are schematic diagrams of changes in gate-source voltage (Vgs) of a power transistor according to an embodiment of the disclosure. The description of the changes in gate-source voltage (Vgs) of FIG. 7A and FIG. 7B is applicable to FIG. 1, FIG. 3, and FIG. 6. Taking FIG. 1 as an example, referring to FIG. 1 and FIG. 7A, curve 711 is used to indicate that the charge sharing circuit 110 does not include the first capacitor C1 (which may be regarded as the capacitance value being equal to 0), the second capacitor C2 (which may be regarded as the capacitance value being equal to 0), the first resistor R1 (which may be regarded as the resistance value being equal to 0), and the second resistor R2 (which may be regarded as the resistance value being equal to 0). In this regard, when the power transistor 210 switches from a high voltage level (for example, 15 volts) to a low voltage level (for example, −5 volts), in the case where there is no first capacitor C1, second capacitor C2, first resistor R1, and second resistor R2, the power transistor 210 may overshoot during the switching process of the gate-source voltage (Vgs). For example, as shown in FIG. 7A, an instantaneous voltage change in the gate-source voltage (Vgs) may drop to −20 volts, so there may be a higher overshoot ratio (that is, a result of the peak voltage divided by a steady-state voltage after voltage switching).

Curve 712 is used to indicate that the charge sharing circuit 110 does not include the first capacitor C1 (which may be regarded as the capacitance value being equal to 0) and the second capacitor C2 (which may be regarded as the capacitance value being equal to 0). In this regard, when the power transistor 210 switches from a high voltage level (for example, 15 volts) to a low voltage level (for example, −5 volts), in the case where there is no first capacitor C1 and second capacitor C2, the power transistor 210 may have a higher energy loss during the switching process of the gate-source voltage (Vgs).

Curve 713 is used to indicate the case where the charge sharing circuit 110 includes the first capacitor C1, the second capacitor C2, the first resistor R1, and the second resistor R2. In this regard, when the power transistor 210 switches from a high voltage level (for example, 15 volts) to a low voltage level (for example, −5 volts), the overshoot of the power transistor 210 during the switching process of the gate-source voltage (Vgs) may be effectively suppressed, and the power transistor 210 may have a lower energy loss during the switching process of the gate-source voltage (Vgs).

Taking FIG. 1 as an example, referring to FIG. 1 and FIG. 7B, curve 721 is used to indicate that the charge sharing circuit 110 does not include the first capacitor C1 (which may be regarded as the capacitance value being equal to 0), the second capacitor C2 (which may be regarded as the capacitance value being equal to 0), the first resistor R1 (which may be regarded as the resistance value being equal to 0), and the second resistor R2 (which may be regarded as the resistance value being equal to 0). In this regard, when the power transistor 210 switches from a low voltage level (for example, −5 volts) to a high voltage level (for example, 15 volts), in the case where there is no first capacitor C1, second capacitor C2, first resistor R1, and second resistor R2, the power transistor 210 may overshoot during the switching process of the gate-source voltage (Vgs). For example, as shown in FIG. 7B, an instantaneous voltage change in the gate-source voltage (Vgs) may rise more than 25 volts, thus having a higher overshoot ratio (that is, a result of the peak voltage divided by a steady-state voltage after voltage switching).

Curve 722 is used to indicate that the charge sharing circuit 110 does not include the first capacitor C1 (which may be regarded as the capacitance value being equal to 0) and the second capacitor C2 (which may be regarded as the capacitance value being equal to 0). In this regard, when the power transistor 210 switches from a low voltage level (for example, −5 volts) to a high voltage level (for example, 15 volts), in the case where there is no first capacitor C1 and second capacitor C2, the power transistor 210 may have a higher energy loss during the switching process of the gate-source voltage (Vgs).

Curve 723 is used to indicate the case where the charge sharing circuit 110 includes the first capacitor C1, the second capacitor C2, the first resistor R1, and the second resistor R2. In this regard, when the power transistor 210 switches from a low voltage level (for example, −5 volts) to a high voltage level (for example, 15 volts), the overshoot of the power transistor 210 during the switching process of the gate-source voltage (Vgs) may be effectively suppressed, and the power transistor 210 may have a lower energy loss during the switching process of the gate-source voltage (Vgs).

In summary, the gate driver circuit and the operating method thereof of the disclosure can effectively suppress the voltage/current overshoot of the transistor during the switching process through the resistor and the capacitor in the charge sharing circuit, and can reduce the energy loss of switching to effectively improve the reliability of switching, reduce stress, and/or delay the aging of the transistor.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. A gate driver circuit, comprising:

a charge sharing circuit, comprising:

a first resistor, wherein a first terminal of the first resistor is coupled to a first working voltage;

a first capacitor, wherein a first terminal of the first capacitor is coupled to a second terminal of the first resistor, and a second terminal of the first capacitor is coupled to a second working voltage;

a first switching transistor, wherein a first terminal of the first switching transistor is coupled to the second terminal of the first resistor and the first terminal of the first capacitor, a control terminal of the first switching transistor receives a first switching signal, and a second terminal of the first switching transistor is coupled to a circuit node;

a second switching transistor, wherein a first terminal of the second switching transistor is coupled to the circuit node, and a control terminal of the second switching transistor receives a second switching signal;

a second capacitor, wherein a first terminal of the second capacitor is coupled to a second terminal of the second switching transistor, and a second terminal of the second capacitor is coupled to the second working voltage; and a second resistor, wherein a first terminal of the second resistor is coupled to the second terminal of the second switching transistor, and a second terminal of the second resistor is coupled to the second working voltage.

2. The gate driver circuit according to claim 1, wherein a conduction period of the first switching transistor and a conduction period of the second switching transistor are non-overlapping and have a time interval.

3. The gate driver circuit according to claim 1, wherein the first switching transistor is a P-type transistor, and the second switching transistor is an N-type transistor.

4. The gate driver circuit according to claim 1, further comprising:

a potential transducer, coupled to the charge sharing circuit and used to receive a first input signal and a second input signal, and convert potentials of the first input signal and the second input signal to generate the first switching signal and the second switching signal.

5. The gate driver circuit according to claim 4, wherein the potential transducer comprises:

a first operational amplifier, wherein a first input terminal of the first operational amplifier receives the first input signal, and an output terminal of the first operational amplifier is coupled to the control terminal of the first switching transistor; and a second operational amplifier, wherein a first input terminal of the second operational amplifier receives the second input signal, and an output terminal of the second operational amplifier is coupled to the control terminal of the second switching transistor.

6. The gate driver circuit according to claim 5, wherein the potential transducer further comprises:

a first voltage dividing resistor, coupled between a second input terminal of the first operational amplifier and a reference voltage;

a second voltage dividing resistor, coupled between the output terminal of the first operational amplifier and the second input terminal of the first operational amplifier;

a third voltage dividing resistor, coupled between a second input terminal of the second operational amplifier and the reference voltage; and a fourth voltage dividing resistor, coupled between the output terminal of the second operational amplifier and the second input terminal of the second operational amplifier.

7. The gate driver circuit according to claim 4, further comprising:

a non-overlapping double pulse generator, coupled to the potential transducer, receiving a control signal, and generating the first input signal and the second input signal according to the control signal, wherein a rising edge and a falling edge of each pulse wave of the first input signal and a rising edge and a falling edge of each pulse wave of the second input signal are non-overlapping.

8. The gate driver circuit according to claim 7, wherein the control signal is a pulse width modulation signal.

9. The gate driver circuit according to claim 7, wherein the non-overlapping double pulse generator comprises:

a first buffer, wherein an input terminal of the first buffer receives the control signal;

a first inverter, wherein an input terminal of the first inverter is coupled to an output terminal of the first buffer;

a first AND gate, wherein a first input terminal of the first AND gate is coupled to an output terminal of the first inverter;

a second buffer, wherein an input terminal of the second buffer is coupled to an output terminal of the first AND gate, and an output terminal of the second buffer is coupled to the non-overlapping double pulse generator to output the first input signal;

a second inverter, wherein an input terminal of the second inverter is coupled to the output terminal of the first buffer;

a resistor, wherein a first terminal of the resistor is coupled to an output terminal of the second inverter;

a capacitor, wherein a first terminal of the capacitor is coupled to a second terminal of the resistor, and a second terminal of the capacitor is coupled to a ground voltage;

a third inverter, wherein an input terminal of the third inverter is coupled to the second terminal of the resistor;

a fourth inverter, wherein an input terminal of the fourth inverter is coupled to an output terminal of the third inverter, and an output terminal of the fourth inverter is coupled to a second input terminal of the first inverter;

a second AND gate, wherein a first input terminal of the second AND gate is coupled to the output terminal of the third inverter, and a second input terminal of the second AND gate is coupled to the output terminal of the first buffer; and a fifth inverter, wherein an input terminal of the fifth inverter is coupled to an output terminal of the second AND gate, and an output terminal of the fifth inverter is coupled to the non-overlapping double pulse generator to output the second input signal.

10. The gate driver circuit according to claim 1, wherein the charge sharing circuit further comprises:

an output resistor, wherein a first terminal of the output resistor is coupled to the circuit node, and a second terminal of the output resistor is coupled to a gate of a power transistor.

11. An operating method, adapted to a gate driver, wherein the gate driver comprises a charge sharing circuit, wherein the charge sharing circuit comprises a first resistor, a second resistor, a first capacitor, a second capacitor, a first switching transistor, and a second switching transistor, wherein a first terminal of the first resistor is coupled to a first working voltage, wherein a first terminal of the first capacitor is coupled to a second terminal of the first resistor, and a second terminal of the first capacitor is coupled to a second working voltage, wherein a first terminal of the first switching transistor is coupled to the second terminal of the first resistor and the first terminal of the first capacitor, and a second terminal of the first switching transistor is coupled to a circuit node, wherein a first terminal of the second switching transistor is coupled to the circuit node, wherein a first terminal of the second capacitor is coupled to a second terminal of the second switching transistor, and a second terminal of the second capacitor is coupled to the second working voltage, wherein a first terminal of the second resistor is coupled to the second terminal of the second switching transistor, and a second terminal of the second resistor is coupled to the second working voltage, the operating method comprising:

receiving a first switching signal through a control terminal of the first switching transistor; and receiving a second switching signal through a control terminal of the second switching transistor, wherein a conduction period of the first switching transistor and a conduction period of the second switching transistor are non-overlapping and have a time interval.

12. The operating method according to claim 11, further comprising:

receiving a first input signal and a second input signal through a potential transducer; and converting potentials of the first input signal and the second input signal through the potential transducer to generate the first switching signal and the second switching signal.

13. The operating method according to claim 12, further comprising:

receiving a control signal through a non-overlapping double pulse generator; and generating the first input signal and the second input signal according to the control signal through the non-overlapping double pulse generator, wherein a rising edge and a falling edge of each pulse wave of the first input signal and a rising edge and a falling edge of each pulse wave of the second input signal are non-overlapping.

14. The operating method according to claim 13, wherein the control signal is a pulse width modulation signal.

* * * * *